United States Patent
Hshieh

(10) Patent No.: US 8,022,471 B2
(45) Date of Patent: Sep. 20, 2011

(54) TRENCH METAL OXIDE SEMICONDUCTOR FIELD EFFECT TRANSISTOR (MOSFET) WITH LOW GATE TO DRAIN COUPLED CHARGES (QGD) STRUCTURES

(75) Inventor: Fwu-Iuan Hshieh, Saratoga, CA (US)

(73) Assignee: Force-MOS Technology Corp. (KY)

( * ) Notice: Subject to any disclaimer, the term of this patent is extended or adjusted under 35 U.S.C. 154(b) by 0 days.

(21) Appl. No.: 12/319,188

(22) Filed: Dec. 31, 2008

(65) Prior Publication Data

US 2010/0163975 A1 Jul. 1, 2010

(51) Int. Cl.
*H01L 29/76* (2006.01)
(52) U.S. Cl. ... 257/329; 257/335; 257/341; 257/E21.41; 257/E29.262
(58) Field of Classification Search .......... 257/329–335, 257/341
See application file for complete search history.

(56) References Cited

U.S. PATENT DOCUMENTS

| 5,929,481 A * | 7/1999 | Hshieh et al. ............ 257/328 |
| 2006/0267088 A1 * | 11/2006 | Sharp et al. ............ 257/341 |
| 2006/0273384 A1 * | 12/2006 | Hshieh ............ 257/330 |

* cited by examiner

*Primary Examiner* — Thanh Nguyen
(74) *Attorney, Agent, or Firm* — Bo-In Lin

(57) ABSTRACT

A trenched semiconductor power device includes a plurality of trenched gates surrounded by source regions near a top surface of a semiconductor substrate encompassed in body regions. The trenched semiconductor power device further comprises tilt-angle implanted body dopant regions surrounding a lower portion of trench sidewalls for reducing a gate-to-drain coupling charges Qgd between the trenched gates and a drain disposed at a bottom of the semiconductor substrate. The trenched semiconductor power device further includes a source dopant region disposed below a bottom surface of the trenched gates for functioning as a current path between the drain to the source for preventing a resistance increase caused by the body dopant regions surrounding the lower portions of the trench sidewalls.

10 Claims, 13 Drawing Sheets

TRENCH METAL OXIDE SEMICONDUCTOR FIELD EFFECT TRANSISTOR (MOSFET) WITH LOW GATE TO DRAIN COUPLED CHARGES (QGD) STRUCTURES

BACKGROUND OF THE INVENTION

1. Field of the Invention

The invention relates generally to the device configuration and manufacturing methods for fabricating the semiconductor power devices. More particularly, this invention relates to an improved and novel manufacturing process and device configuration for reducing the gate to drain coupled charges (Qgd) while providing a drain to source current path for preventing a drain to source resistance.

2. Description of the Related Art

In order to increase the switching speed of a semiconductor power device, it is desirable to reduce the coupling charges between the gates and drain Qgd such that a reduction of a gate to drain capacitance Crss can be reduced. However, conventional device as shown in FIG. 1 has a large amount of coupling charges Qgd between the gates and drain due to the direct coupling between the sidewalls of the trench gates and the drain. Specifically, Kobayashi discloses in a U.S. Pat. No. 6,888,196 entitled "Vertical MOSFET reduced in Cell Size and Method of Producing the Same" a vertical MOSFET device as that shown in FIG. 1.

In order to reduce the capacitance Crss, a double poly gates and double gate oxide layers (a thick gate oxide on trench bottom) formed in trench with lower poly gate connected to source are disclosed in U.S. Pat. Nos. 7,091,573 and 7,183,610. However, formation of the device structures is very complicate and expensive.

Therefore, a need still exists in the art of power semiconductor device design and manufacture to provide new manufacturing method and device configuration in forming the semiconductor power devices such that the above discussed problems and limitations can be resolved.

SUMMARY OF THE PRESENT INVENTION

It is therefore an aspect of the present invention to provide a new and improved semiconductor power device by forming P* dopant regions surrounding the lower portions of the gate sidewalls to decouple the gate from the drain such that the coupling charges between the gate and the drain can be reduced. Furthermore, a N* dopant region is formed right below the trench bottom to provide a current path between the drain to the source such that the decoupling P* dopant regions will not inadvertently increase the drain to source resistance but Crss can be significantly reduced to a capacitance that is about half or even lower when compared with the capacitance of the conventional devices because the Crss will be mainly determined by trench width in the present invention when compared with the conventional device as shown in FIG. 1.

Another aspect of this invention is to form an improved MOSFET device by forming P* dopant regions surrounding the lower portions of the gate sidewalls to reduce the gate-to-drain coupling charges and N* regions below the bottom of the trenches to provide a drain to current path. Furthermore, the improved MOSFET device is formed with thicker oxide layer at the bottom of the trenched gate such that the gate to drain capacitance can be reduced. The performance of the device is improved with reduced Qgd by reducing the coupling areas between the gates to the drain. The drain to source resistance is reduced with a current path provided by the N* dopant regions below the bottom of the trenches.

Briefly in a preferred embodiment, this invention discloses a trenched semiconductor power device comprising a plurality of trenched gates surrounded by source regions near a top surface of a semiconductor substrate encompassed in body regions. The trenched semiconductor power device further includes tilt-angle implanted body dopant regions surrounding a lower portion of trench sidewalls for reducing a gate-to-drain coupling charges Qgd between the trenched gates and a drain disposed at a bottom of the semiconductor substrate. The trenched semiconductor power device further includes a source dopant region disposed below a bottom surface of the trenched gates for functioning as a current path between the drain to the source for preventing a resistance increase caused by the body dopant regions surrounding the lower portions of the trench sidewalls. In an exemplary embodiment, each of the trenched gates has a thicker oxide layer on sidewalls of a lower portion of the trenched gates and a thinner oxide layer on sidewalls at an upper portion of the trenched gates. In another exemplary embodiment, the semiconductor power device further comprises a metal oxide semiconductor field effect transistor (MOSFET) device. In another exemplary embodiment, the semiconductor power device further comprising a N-channel MOSFET device wherein the body dopant regions comprising P-type tilt-angle implanted regions surrounding the lower portion of the trench sidewalls and the source dopant regions below the trenched gates comprising N-dopant regions disposed in an N-type epitaxial layer. In another exemplary embodiment, the semiconductor power device further comprising a P-channel MOSFET device wherein the body dopant regions comprising N-type tilt-angle implanted regions surrounding the lower portion of the trench sidewalls and the source dopant regions below the trenched gates comprising P-dopant regions disposed in an P-type epitaxial layer. In another exemplary embodiment, the trenched semiconductor power device further includes an insulation layer overlaying a top surface of the semiconductor substrate having a plurality of source/body contact trenches opened therethrough extended to aid body regions through the source regions wherein the source/body contact trenches are filled with a contact meal plug composed of tungsten for electrically contacting to the source/body regions and body regions covered by the insulation layer. In another exemplary embodiment, the trenched semiconductor power device further includes a contact dopant regions disposed in the body regions below the source/body contact trenches constituting heavily body dopant regions for enhancing a contact with the contact metal plugs. In another exemplary embodiment, the trenched semiconductor power device further includes a contact enhancement layer comprising a low resistance meta layer covering the insulation layer for contacting to the contact metal plugs for providing a larger contact area to a source metal layer disposed on top of the contact enhancement layer for reducing a resistance between the source metal layer and the contact metal plugs contacting the source regions and body regions. In another exemplary embodiment, the trenched semiconductor power device further includes a source metal layer comprising a patterned metal layer disposed on top of the insulation layer for electrically contacting to the metal plugs filling the contact trenches for electrically connected to the source regions and body regions. In another exemplary embodiment, the trenched semiconductor power device further includes a gate pad layer comprising a patterned metal layer disposed on top of the insulation layer for electrically contacting to the metal plugs filling the contact trenches for electrically connected to the trenched gates.

This invention further discloses a method for manufacturing a trenched semiconductor power device on a semiconductor substrate. The method further includes steps of: 1) opening a plurality of trenches from a top surface of the semiconductor substrate; and 2) carrying out a tilt-angle body-dopant implantation through sidewalls of trenches to form body dopant regions surrounding sidewalls of the trenches followed by carrying out a vertical source dopant implant to form a source dopant region below a bottom surface of the trenches. In an exemplary embodiment, the step of carrying out the tilt-angle body dopant implantation through the sidewalls of the trenches further comprising a step of carrying out a tilt angle body dopant implantation with a tilt-angle ranging between 4 to 45 degrees. In another exemplary embodiment, the method further includes a step of growing a screen oxide layer on the sidewalls of the trenches as a protection layer for the sidewalls before carrying out the step of tilt angle body dopant implantation through the sidewalls of the trenches. In another exemplary embodiment, the step of opening a plurality of trenches in the semiconductor substrate further comprising a step of opening the trenches in a N-type silicon substrate and the step of carrying out the tilt angle body dopant implantation further comprising a step of carrying out tilt angle boron implantation through the sidewalls of the trenches into the N-type silicon substrate to form the body dopant regions surrounding the sidewalls of the trenches. In another exemplary embodiment, the step of opening a plurality of trenches in the semiconductor substrate further comprising a step of opening the trenches in a N-type silicon substrate and the step of carrying out a vertical source dopant implant further comprising a step of carrying out the source dopant implant of arsenide ions to form the source dopant region below the bottom surface of the trenches. In another exemplary embodiment, the method further includes a step of growing a gate oxide layer on the sidewalls and the bottom surface of the trenches and depositing a gate dielectric layer into the trenches to form the trenched gates. In another exemplary embodiment, the method further includes a step of growing a gate oxide layer on the sidewalls of the trenches; and the method further includes a step of forming a bottom gate oxide on the bottom surface of the trenches having a greater thickness than the gate oxide on the sidewalls followed by depositing a gate dielectric layer into the trenches to form the trenched gates. In another exemplary embodiment, the method further includes a step of forming body regions and source regions encompassed in the body regions surrounding the trenched gates in the semiconductor substrate and covering semiconductor substrate with an insulation layer followed by opening a plurality of contact trenches through the insulation layer for filling the contact trenches with contact metal plugs with a some of the metal plugs contacting the body regions and source regions and other contact plugs contacting the trenched gates. And the method further includes a step of depositing a metal layer on top of the insulation layer contacting the metal plugs and patterning the metal layer into a source metal and a gate pad. In another exemplary embodiment, the method further includes a step of forming body regions and source regions encompassed in the body regions surrounding the trenched gates in the semiconductor substrate and covering semiconductor substrate with an insulation layer followed by opening a plurality of contact trenches through the insulation layer for filling the contact trenches with contact metal plugs with a some of the metal plugs contacting the body regions and source regions and other contact plugs contacting the trenched gates. And the method further includes a step of depositing a low resistance metal layer on top of the insulation layer for enhancing a contact to the metal plugs and forming a metal layer on top of the low resistance metal layer contacting the metal plugs through the low resistance metal layer and patterning the metal layer into a source metal and a gate pad. In another exemplary embodiment, the method further includes a step of implanting a contact dopant region through the contact trenches before depositing the contact metal plugs into the contact trenches to enhance an electrical contact between the source and body regions to the contact metal plugs.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 6A to 6G-2 are a serial cross sectional views for describing the manufacturing processes to provide a trenched MOSFET device of the present invention with dopant regions surrounding the lower portions of the sidewalls and the bottom of the trenched gates to reduce the Qgd and to provide a drain to source current path.

DETAILED DESCRIPTION OF THE METHOD

Figure 2:
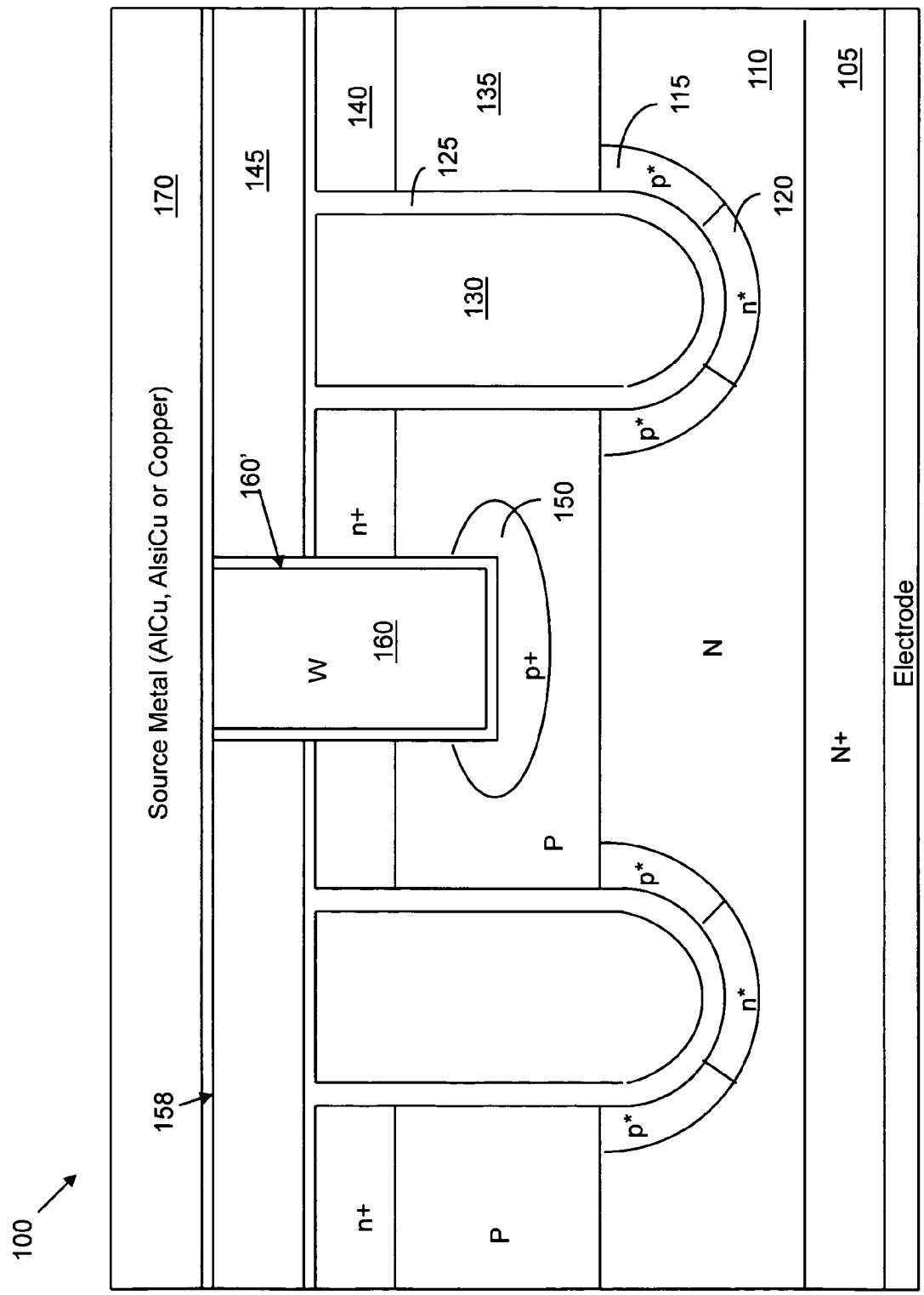
FIGS. 2 to 5 are four alternate embodiments of the present invention of a MOSFET device implemented with dopant regions surrounding the lower portions of the sidewalls and the bottom of the trenched gates to reduce the Qgd and to provide a drain to source current path.

Referring to FIG. 2 for a side cross sectional view of a MOSFET device 100 formed on a N+ substrate 105 supporting an N-epitaxial layer 110 with trenched polysilicon gates 130. Each of these trenched gates 130 is padded by a gate oxide layer 125. A plurality of P-body regions 135 disposed on the upper portion of the epitaxial layer 110 surround the trenched gates 130. The body regions 135 further encompassed source regions 140 formed near the top surface of the epitaxial layer 110 surrounding the trenched gates 130. An oxide insulation layer 145 covering the top surface with contact openings right above the contact enhancing dopant regions 150 are opened through the insulation layer to allow for the metal contact layer 170 to physically contact the source/body regions through a resistance reduction layer 158 to the contact enhancing regions 150. The contact trenches 160 are filled with tungsten contact plugs padded with a barrier layer 160' composed of Ti/TiN. The resistance reduction layer 158 is composed of a low resistance metal layer such as a Ti or Ti/TiN layer. The contact metal layer 170 is further patterned to function as source metal and to provide a gate pad (not specifically shown) to contact the gate. The contact metal layer, e.g., the source metal layer 170 may be composed of AlCu, AlSiCu or copper.

For the purpose of reducing the Qgd, the bottom portion of the sidewalls of the trenched gates 130 is surrounded by P-dopant regions 115. Furthermore, the central portions underneath the bottom of the trenched gates are formed with an N-doped regions 120 below each trenched gates 130. The Qgd is reduced with the P* dopant regions 115 while the N* dopant regions 120 under the trench bottom provide a current path of drain to source thus prevent an inadvertent increase of the resistance. Furthermore, by reducing the Qgd, the capacitance Crss may be reduced to half of the original capacitance or even lower compared to the capacitance of the conventional devices.

Figure 3:
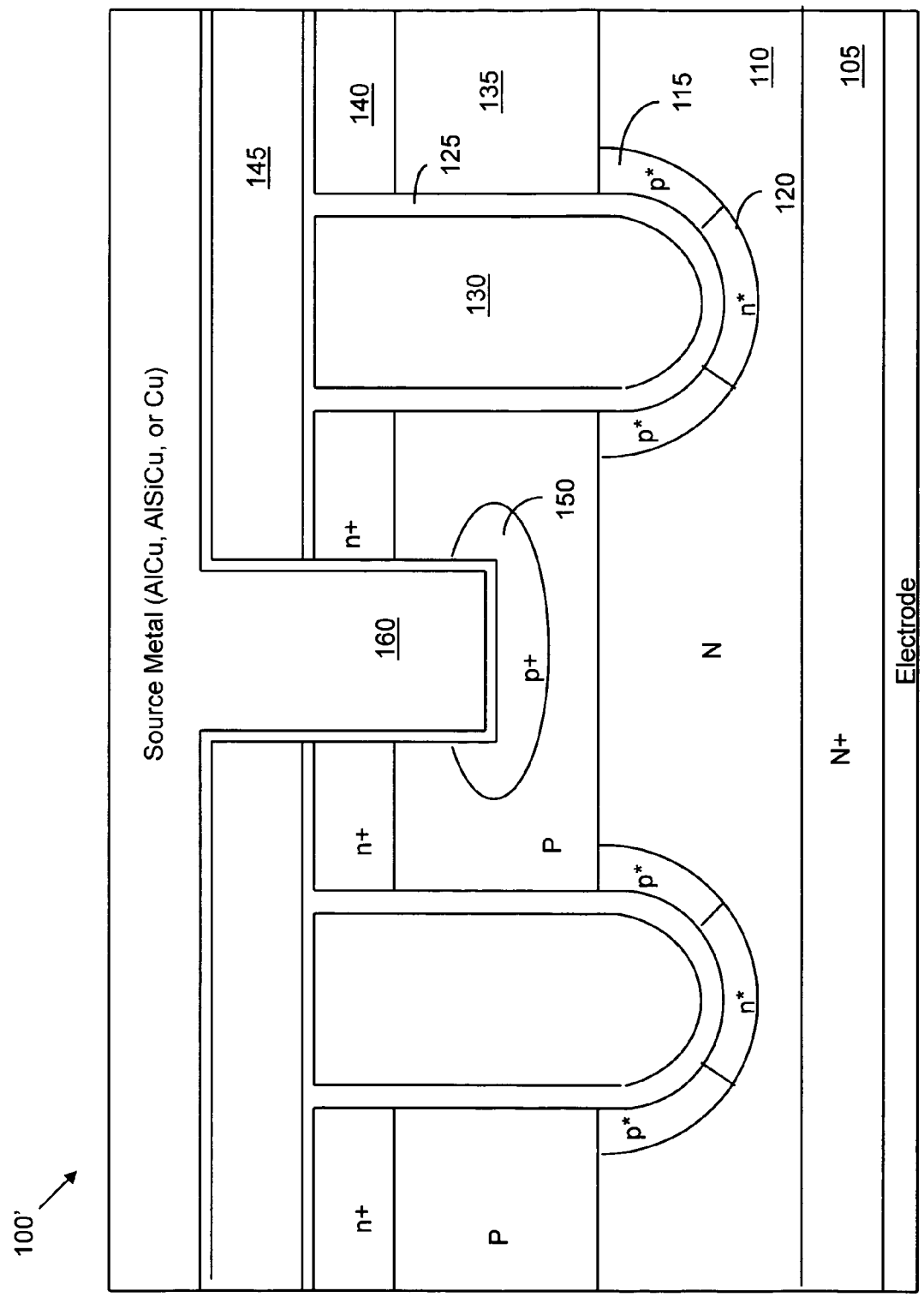

FIG. 3 shows a side cross sectional view of an alternate MOSFET device 100' with similar device configuration as the MOSFET 100 of FIG. 2. The only difference is that the MOSFET 100' does not include tungsten contact plugs and the resistance reduction metal layer 158 as that implemented in the MOSFET device shown in FIG. 2. The source metal layer 170 composed of AlCu, AlSiCu or copper is directly filled into contact trenches padded with a barrier layer 160' composed of Ti/TiN, Co/TiN or Ta/TiN. Again, the MOSFET device 100' has P* dopant regions 115 to reduce the Qgd and also the N* dopant regions underneath the trenched gates 130 thus providing a drain to source current path to reduce the drain to source resistance.

Figure 4:
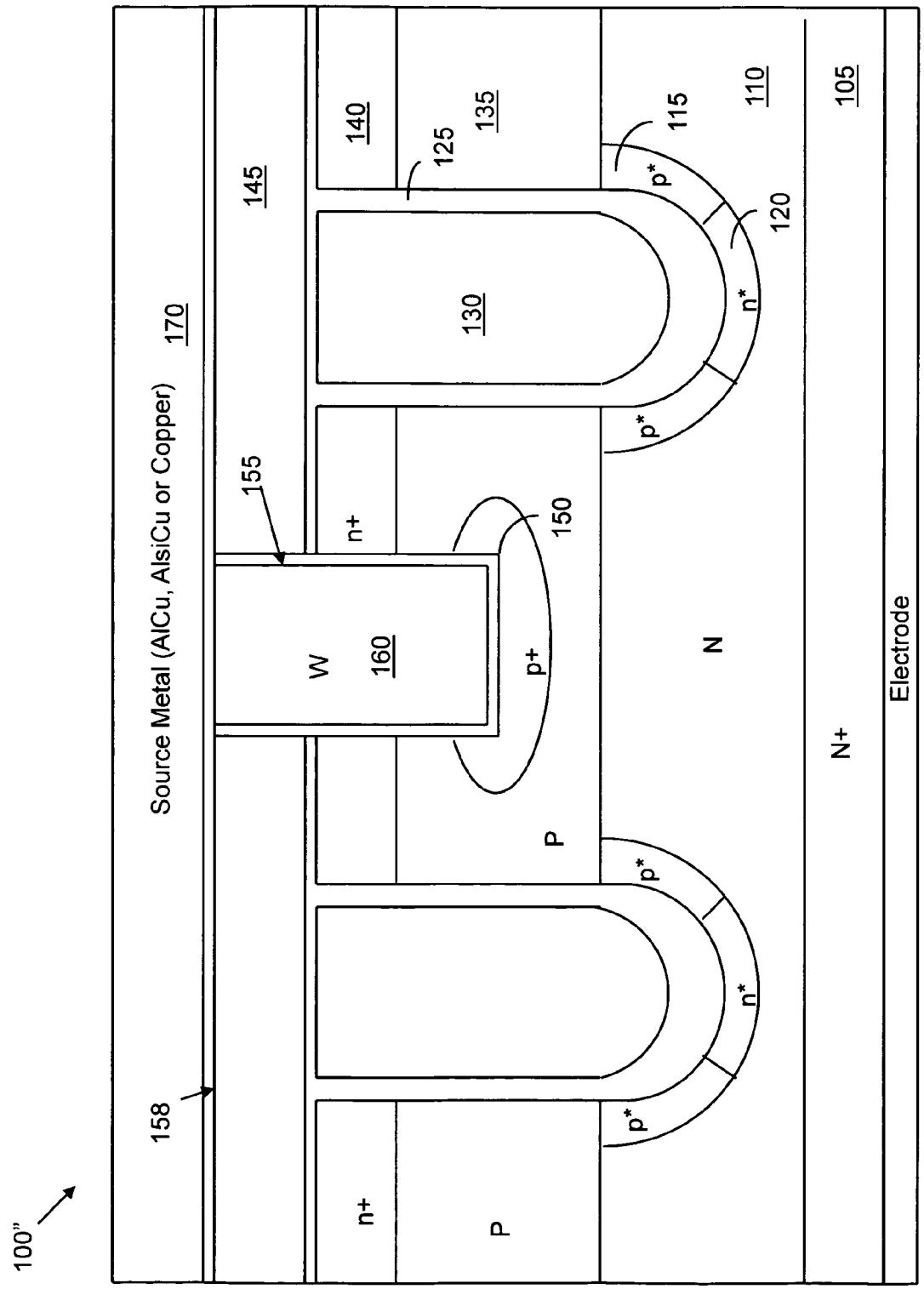

FIG. 4 shows a side cross sectional view of another alternate MOSFET device 100'' with similar device configuration as the MOSFET 100 of FIG. 2. The only difference is that the MOSFET 100'' is implemented with trenched gate 130 padded with a bottom oxide layer 125' that has greater thickness than the gate oxide layer 125 on the sidewalls of the trenches. The greater thickness of the bottom oxide layer 125' further reduces a gate-to-drain coupling capacitance thus improving the switching speed of the MOSFET device 100''.

Figure 5:
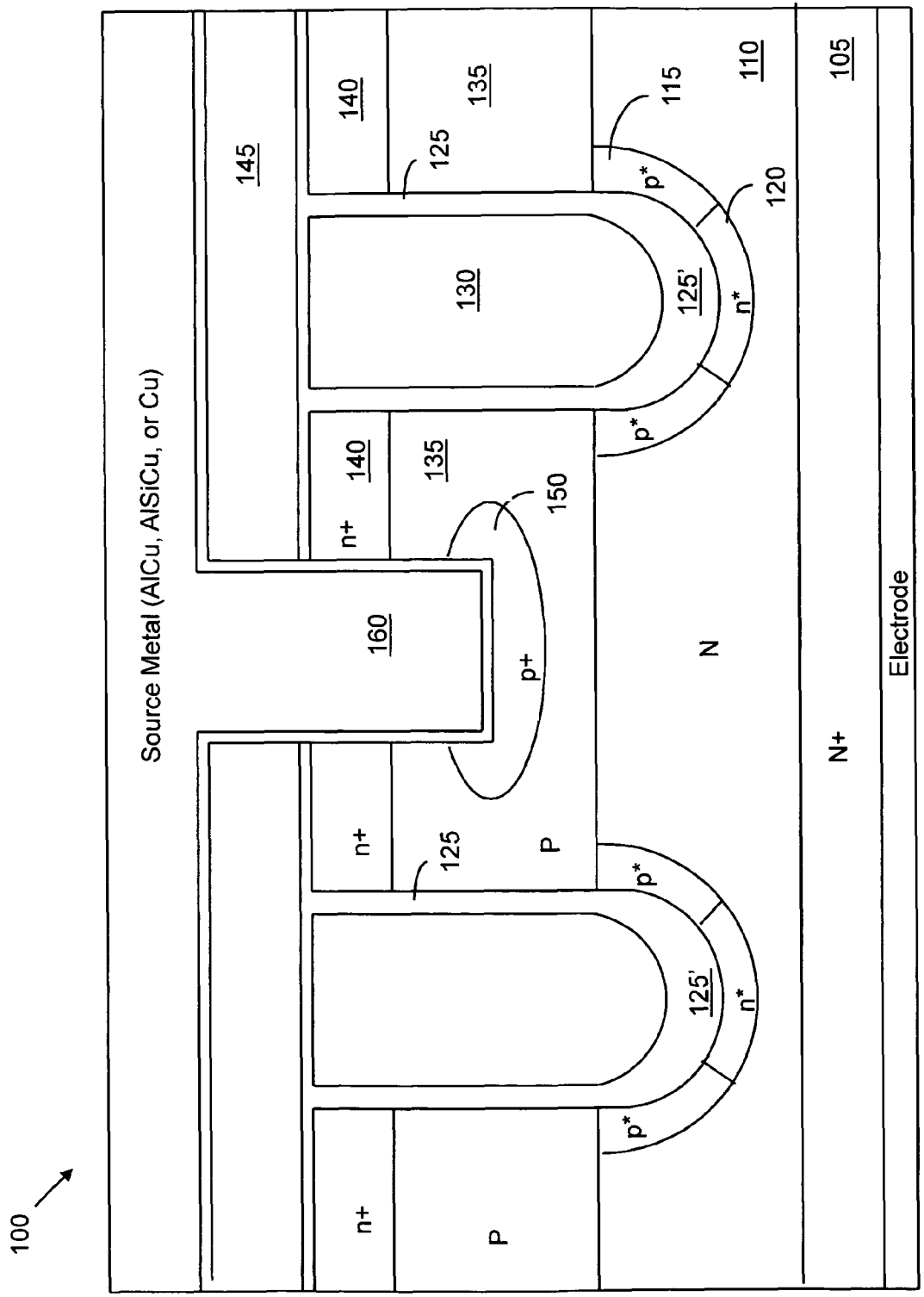

FIG. 5 shows a side cross sectional view of another alternate MOSFET device 100''' that has a device configuration similar to that of the MOSFET 100' shown in FIG. 3. The only difference is that the MOSFET 100''' is implemented with trenched gate 130 padded with a bottom oxide layer 125' that has greater thickness than the gate oxide layer 125 on the sidewalls of the trenches. The greater thickness of the bottom oxide layer 125' further reduces a gate-to-drain coupling capacitance thus improving the switching speed of the MOSFET device 100'''.

Similar to the MOSFET 100 and 100', the MOSFET devices 100'' and 100''' have P* dopant regions 115 surrounding the lower portion of the trench sidewalls to reduce the Qgd. The MOSFET devices 100'' and 100''' further have the N* dopant regions underneath the trenched gates 130 thus providing a drain to source current path to reduce the drain to source resistance.

Figure 6A:
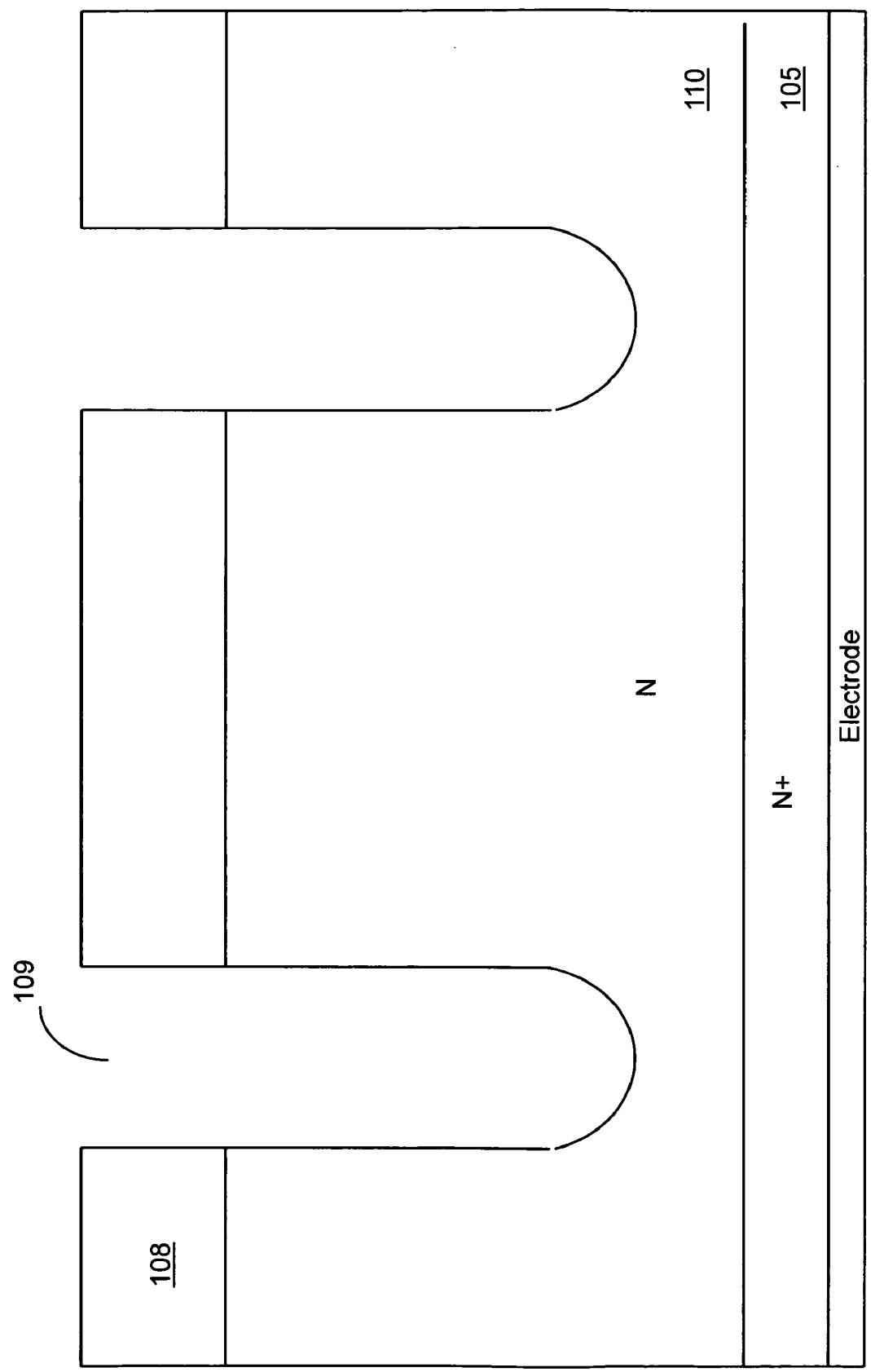
Figure 6B:
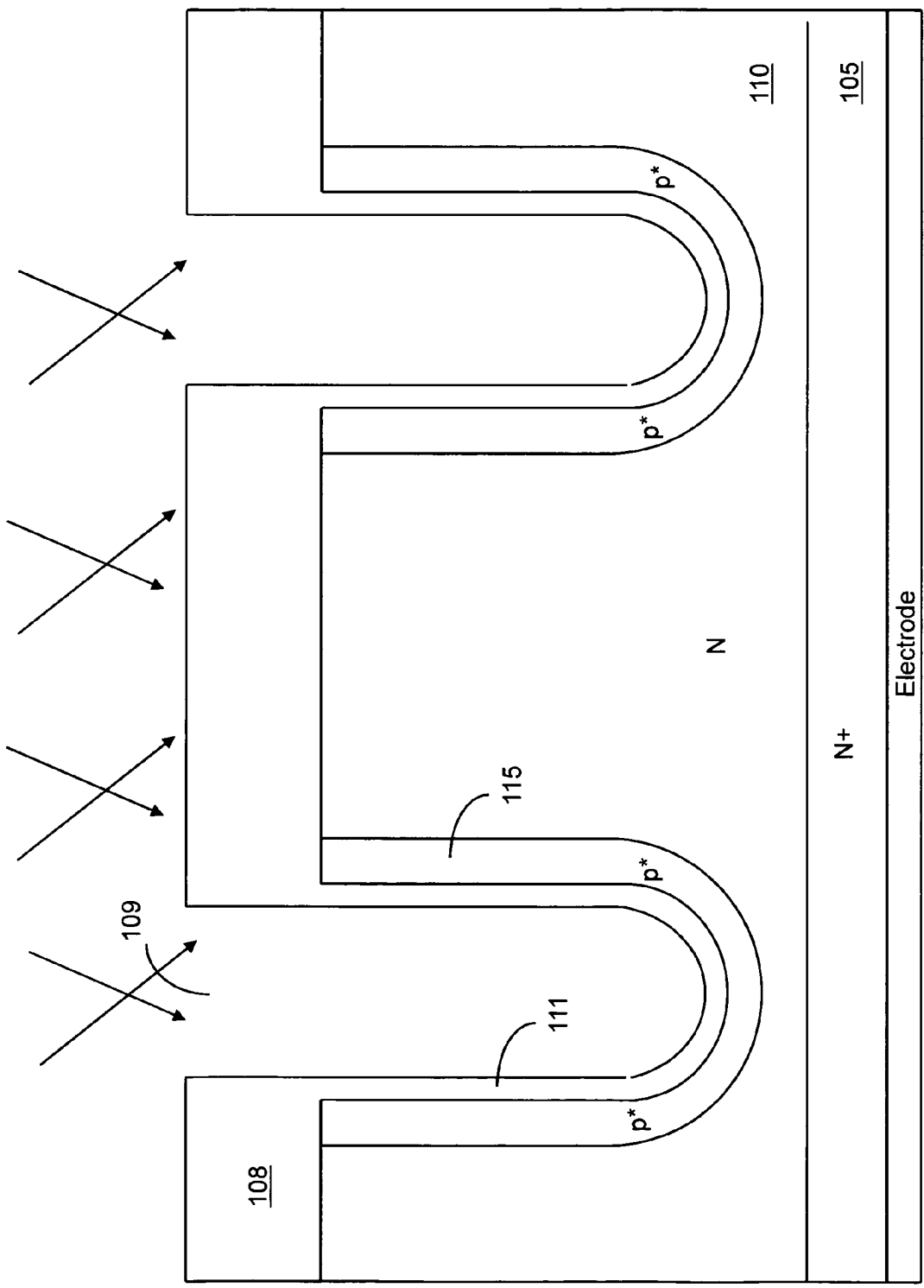
Figure 6C:
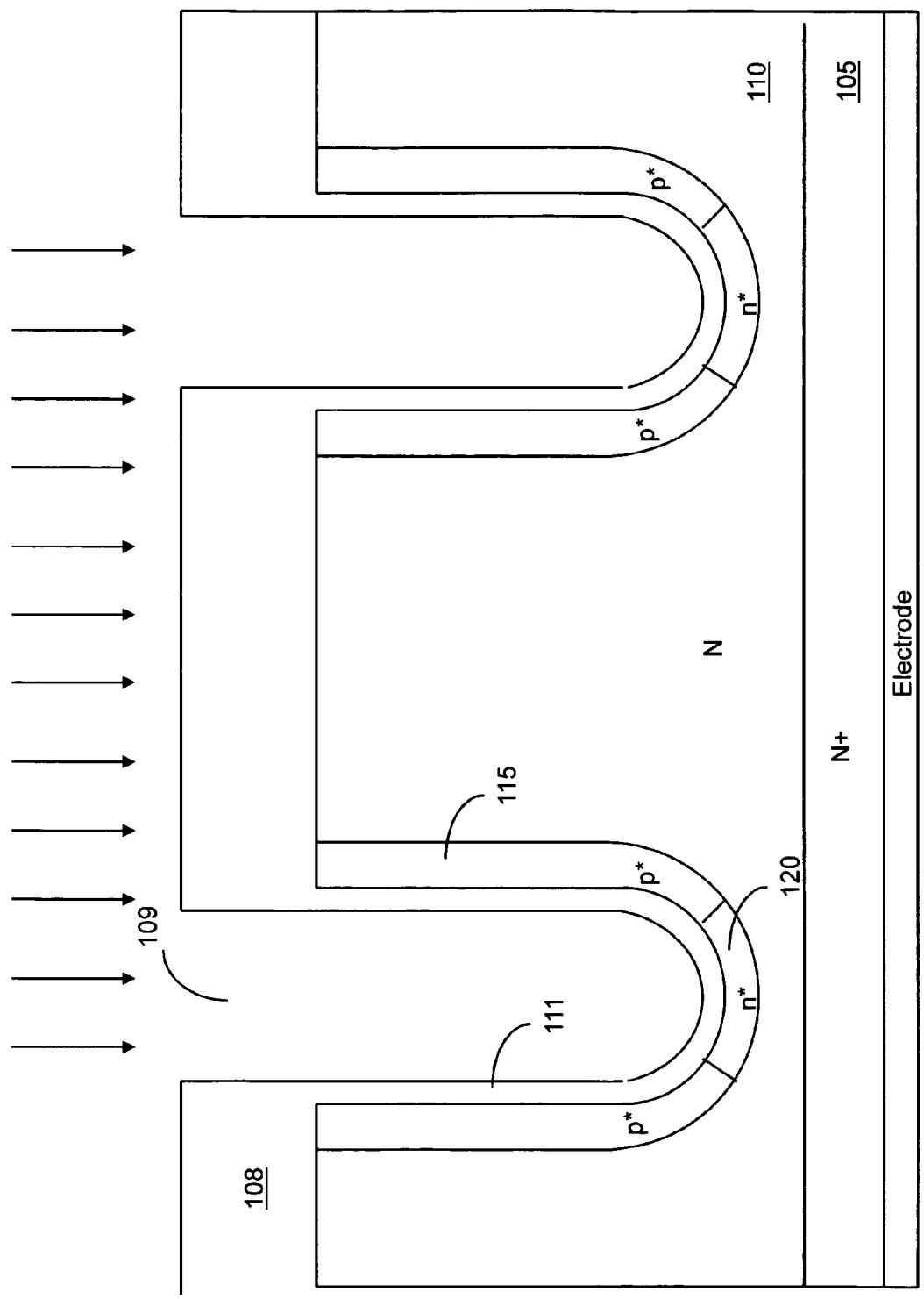

Referring to FIGS. 6A to 6G-1 for a series of cross sectional views to illustrate the processing steps for manufacturing a MOSFET device as shown in FIG. 2. In FIG. 6A, an oxide deposition process is first performed to deposit an oxide layer 108 on top of an N+ silicon substrate 105 supporting an N-type epitaxial layer 110 thereon. A trench mask (not shown) is applied to open a plurality of trenches 109 in an epitaxial layer 110 by applying a dry oxide etch to open a plurality of etch windows through the oxide layer 108 followed by a dry silicon etch to open the trenches into greater depth into the epitaxial layer 110. In FIG. 6B, a sacrificial oxide layer is grown (not shown) and removed to repair the sidewall surface of the trenches damaged by the trench etching process. A screen oxide layer 111 is grown for preventing damages caused by an ion implantation process. Then a boron angular ion implant is carried out to form the P* regions 115 around the sidewalls of the trenches 109 and in the epitaxial layer 110 below the bottom surface of the trenches 109. In FIG. 6C, a vertical ion implant is carried out with N-type ions such as arsenic or phosphorus ions to form. N* regions 120 in a region vertically below the bottom surface of the trenches 109.

Figure 1:
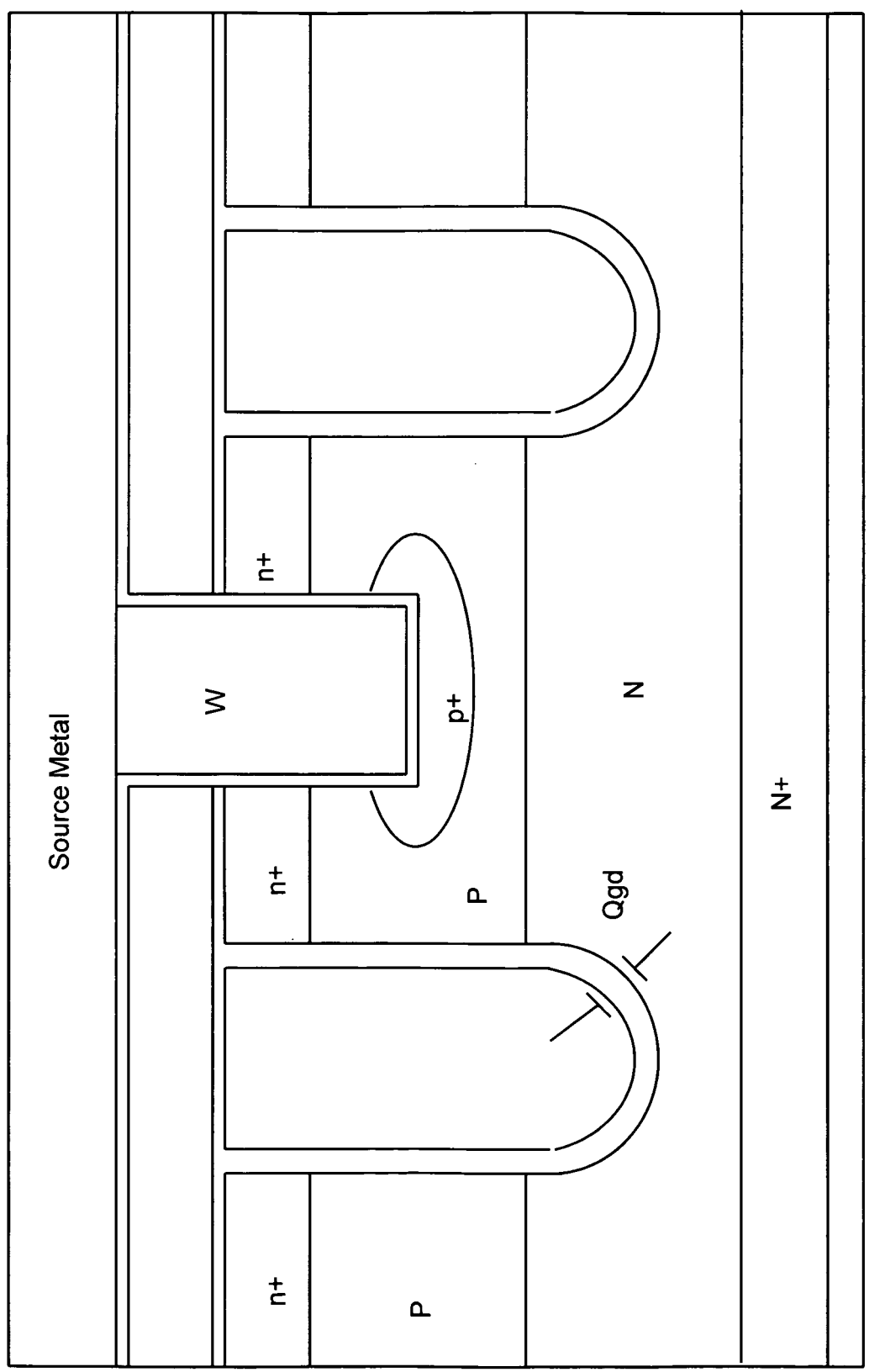
FIG. 1 is a cross sectional view of different conventional trenched MOSFET power devices with reduced gate-to-drain capacitance and reduced epitaxial resistivity.
Figure 6D:
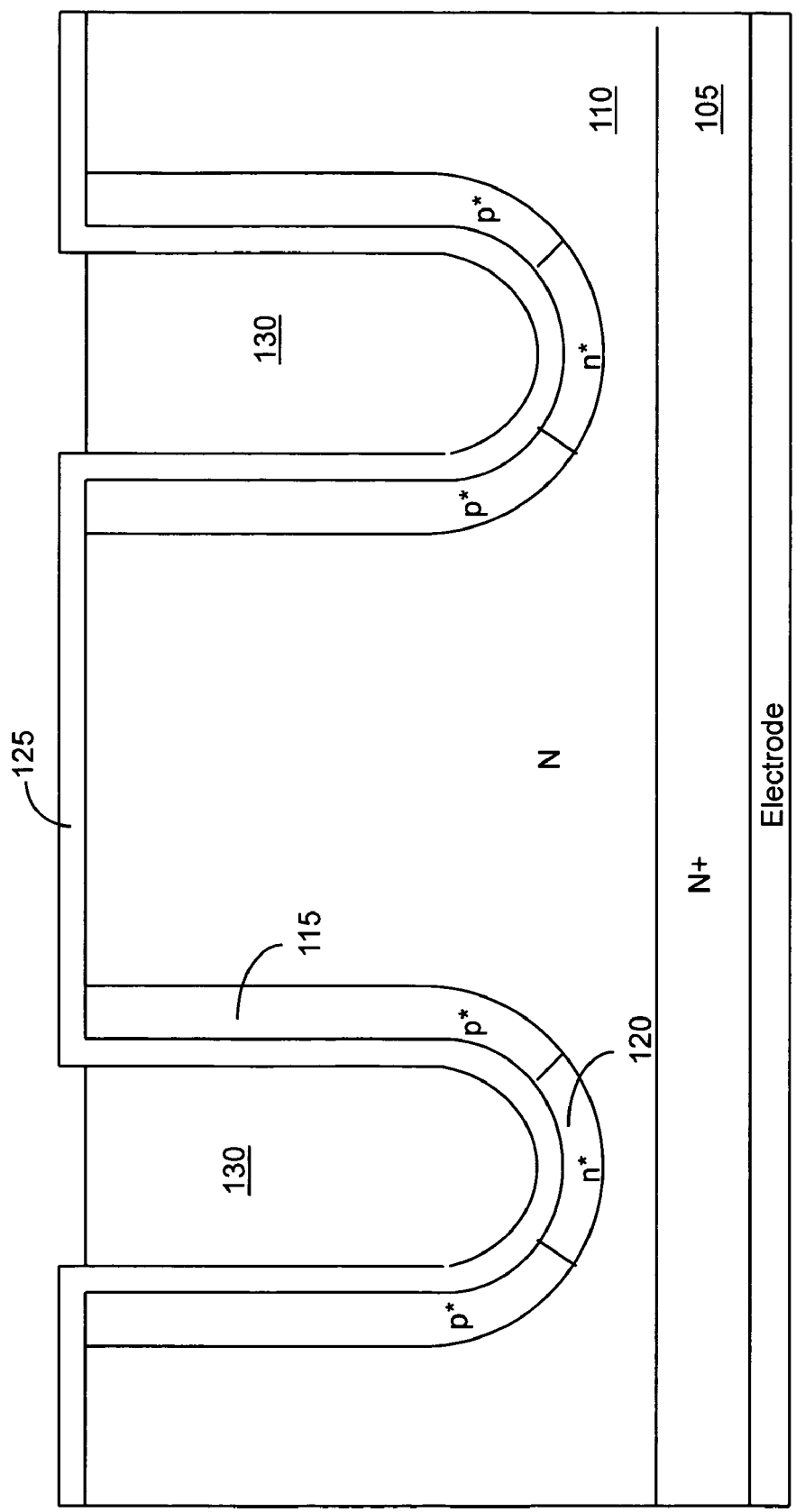
Figure 6E:
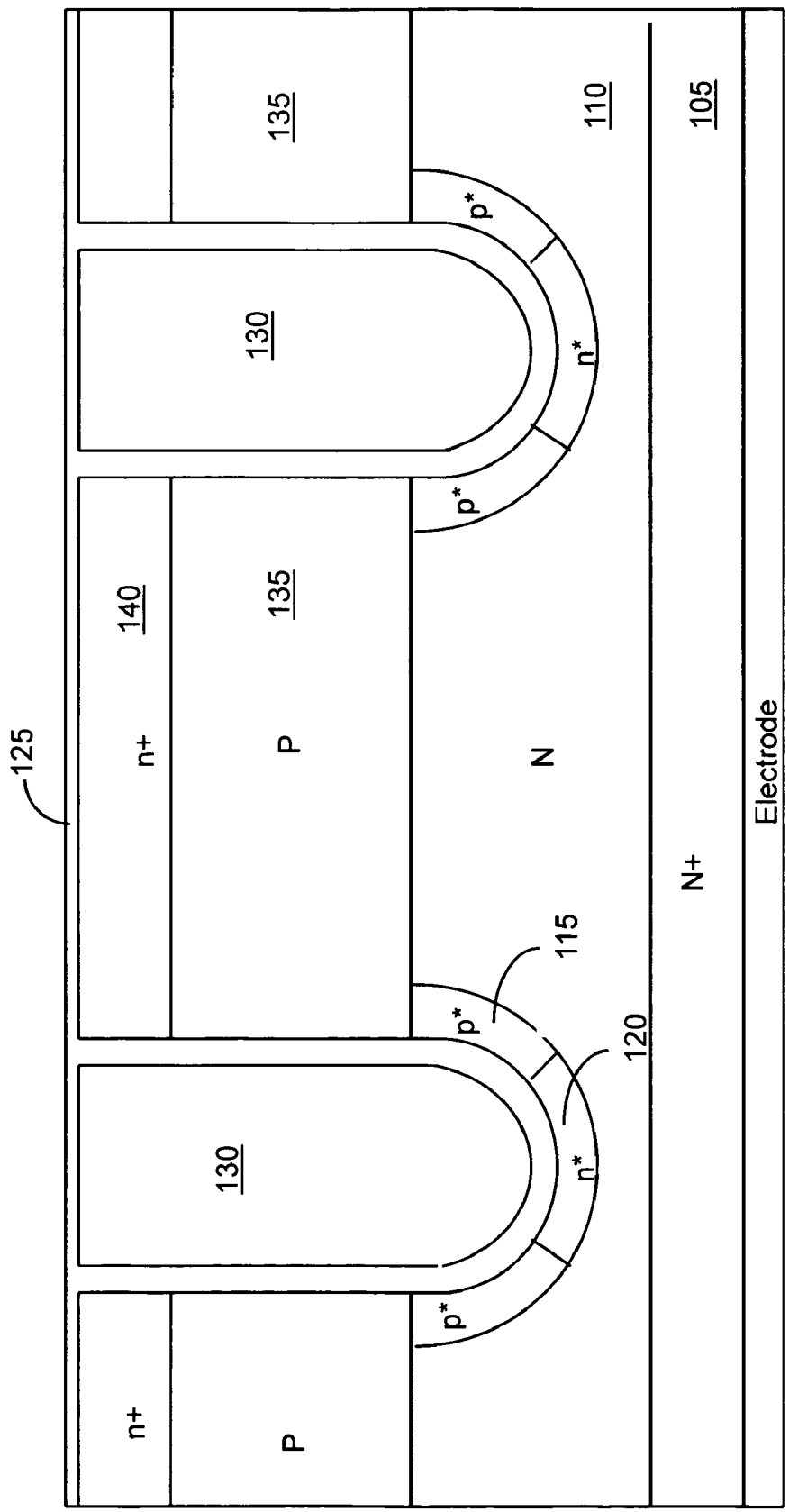
Figure 6F:
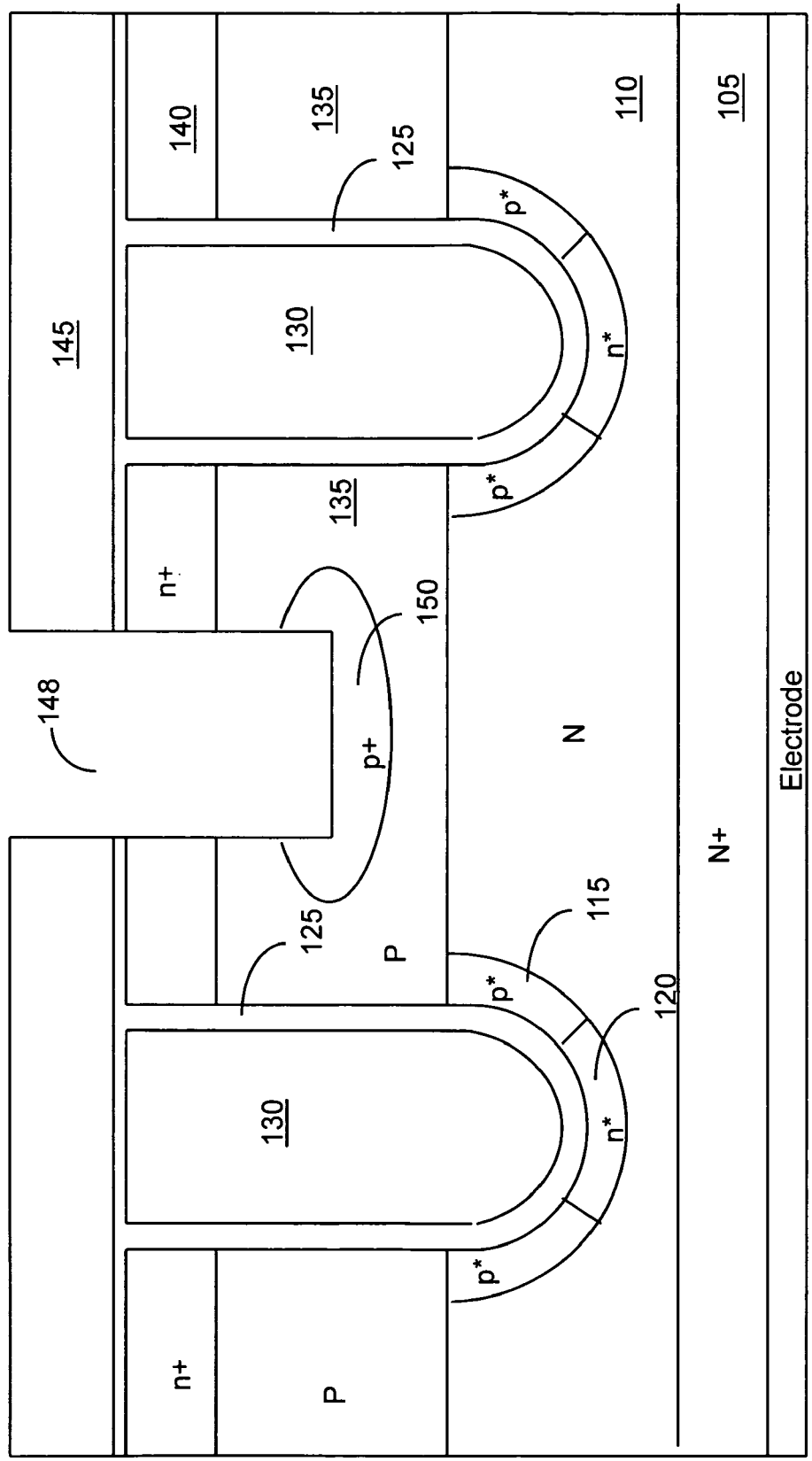
Figures 1, 6G:
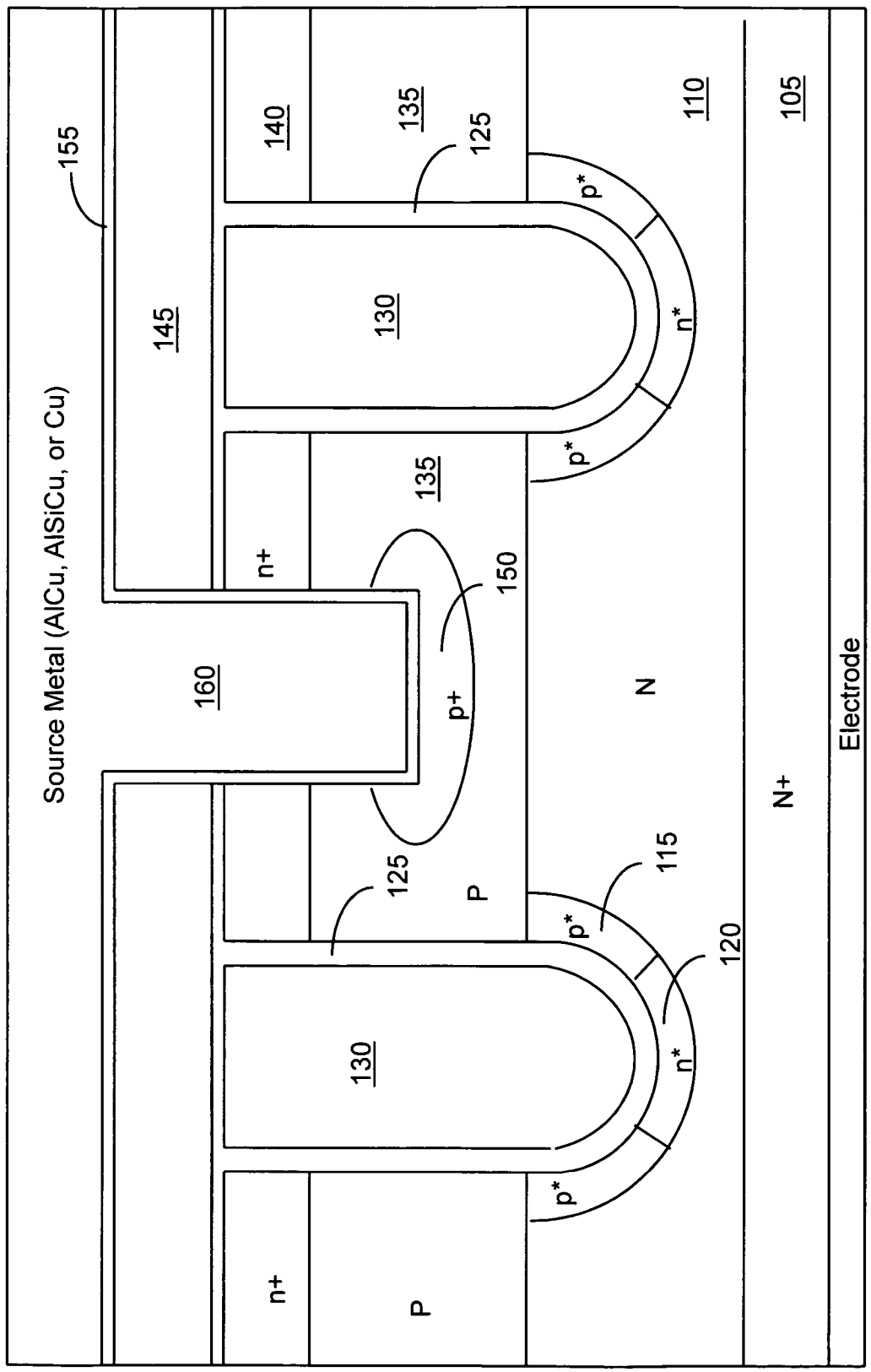
Figures 2, 6G:
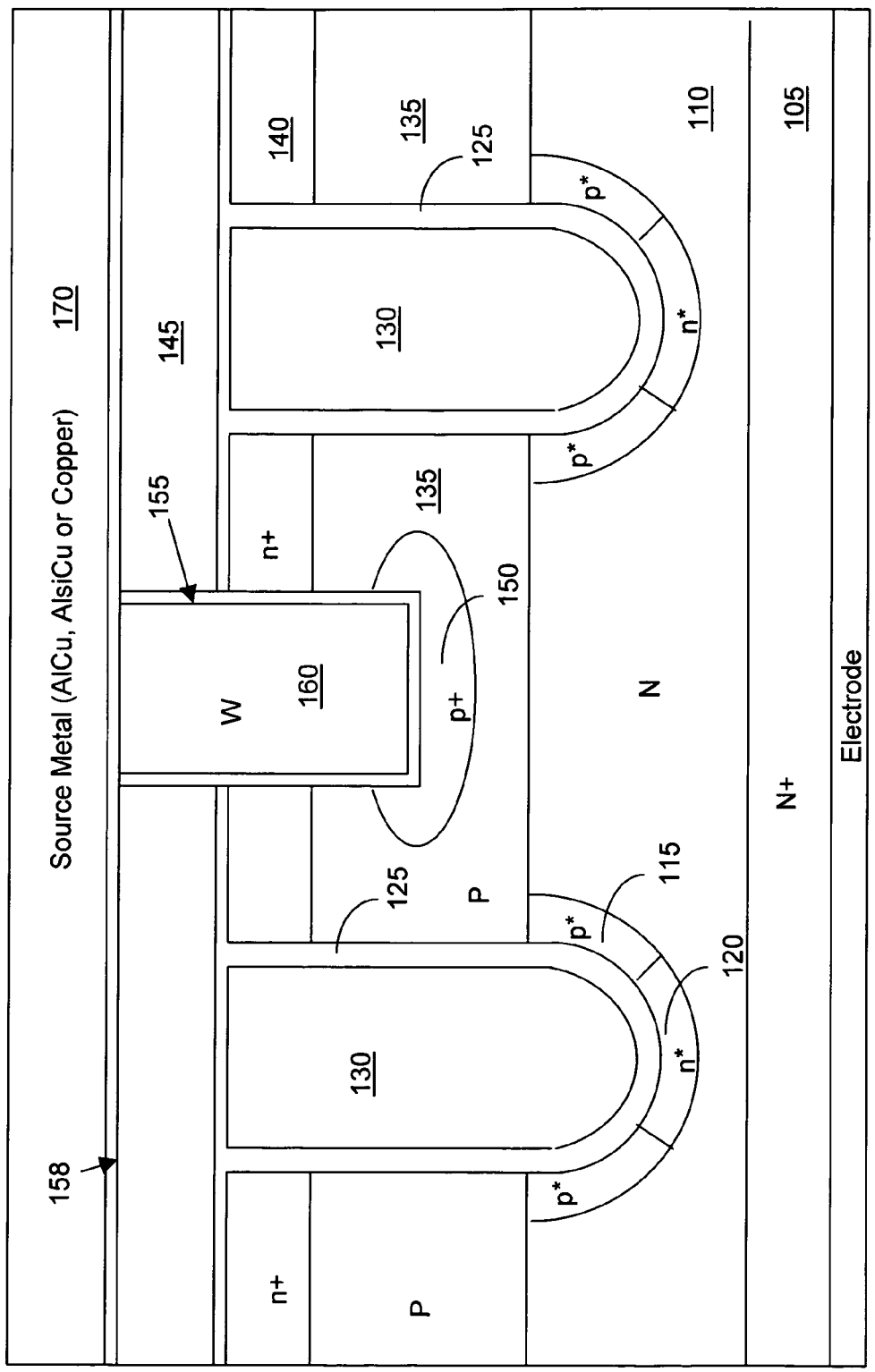

In FIG. 6D, the screen oxide layers 108 and 111 are removed and a gate oxide layer 125 is grown to cover the sidewalls and the bottom of the trenchs 109. A doped polysilicon layer 130 is deposited to fill the trenches followed by etching back the polysilicon layer above the top surface of the trenches. In FIG. 2E, a body dopant implant is performed followed by a body dopant diffusion process to form the body regions 135. Then, a source mask (not shown) is applied to carry out a source dopant implant followed by a source dopant diffusion process to form the source regions 140 near the top surface at the upper portion of the body regions 135. In FIG. 6F, the source mask (not shown) is removed followed by depositing a top oxide insulation layer 145. Then a contact mask (not shown) is applied to perform a dry oxide etch followed by a silicon etch to open a plurality of source/body contact trenches 148 and gate contact trenches (not shown) through the top insulation layer 145. A BF2 implant is carried out to form the contact dopant regions 150 below the contact trenches 148. In FIG. 6G-1, a barrier layer 155 covering the sidewalls and the bottom surface of the contact trenches and composed of Ti/TiN, Co/TiN, or Ta/TiN is formed. Then a contact metal layer 160 composed of AlCu, AlSiCu, or Cu is formed on top of the barrier layer 155 and fill up the contact trenches 148. The metal layer 160 is then patterned to form the source metal and gate pads as part of the standard processing steps. FIG. 6G-2 shown the processes carried out for another preferred embodiment. A barrier layer 155 composed of Ti/TiN is first deposited followed by depositing a tungsten layer 160 on top of the barrier layer 155 to fill up the contact trenches. An etch back process is carried out to etch back the tungsten and Ti/TiN layers from the surface above the contact trenches. Then a contact enhancement layer 158 composed of Ti or Ti/TiN is formed to cover the contact trenches 160 and the top surfaces around the contact trenches. A contact metal layer 170 is then formed on top of the contact enhancement layer 158 wherein the contact enhancement layer 158 provides an expanded contact surface area with the contact metal layer 170 thus reducing the resistance of contact meal layer 170 to the source/body regions through the trench contact 160.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A trenched semiconductor power device formed in a semiconductor substrate comprising:

a plurality of trenched gates having substantially vertical trench sidewalls and rounded trench bottoms surrounded by source regions near a top surface of an epitaxial layer encompassed in body regions along an upper portion of the trench sidewalls;

tilt-angle implanted body dopant regions surrounding a lower portion of the trench sidewalls and an upper portion of said rounded trench bottoms of said trenched gates for reducing a gate-to-drain coupling charges Qgd between said trenched gates and a drain disposed at a bottom of said semiconductor substrate;

said tilt-angle implanted body dopant regions disposed below said body regions between two adjacent trenched gates and spaced apart from each other; and a source dopant region disposed below said round trench bottoms of said trenched gates and adjacent to said tilt-angle implanted body dopant regions for functioning as a current path between said drain to said source for preventing a resistance increase caused by said tilt-angle implanted body dopant regions surrounding said lower portions of said trench sidewalls and said upper portion of said rounded trench bottoms of said trenched gates.

2. The trenched semiconductor power device of claim 1 wherein:

each of said trenched gates having a single gate oxide along trench gates or a thicker oxide layer on bottom portion of said trenched gates and a thinner oxide layer on sidewalls at an upper portion of said trenched gates.

3. The trenched semiconductor power device of claim 1 wherein:

said semiconductor power device further comprising a metal oxide semiconductor field effect transistor (MOSFET) device.

4. The trenched semiconductor power device of claim 1 wherein:

said semiconductor power device further comprising a N-channel MOSFET device wherein said body dopant regions comprising P-type tilt-angle implanted regions surrounding said lower portion of said trench sidewalls and said source dopant regions below said trenched gates comprising N-dopant regions disposed in an N-type epitaxial layer.

5. The trenched semiconductor power device of claim 1 wherein:

said semiconductor power device further comprising a P-channel MOSFET device wherein said body dopant regions comprising N-type tilt-angle implanted regions surrounding said lower portion of said trench sidewalls and said source dopant regions below said trenched gates comprising P-dopant regions disposed in an P-type epitaxial layer.

6. The trenched semiconductor power device of claim 1 further comprising:

an insulation layer overlaying a top surface of said epitaxial layer having a plurality of source/body contact trenches opened therethrough extended to aid body regions through said source regions wherein said source/body contact trenches are filled with a contact meal plug composed of tungsten for electrically contacting to said source/body regions and body regions covered by said insulation layer.

7. The trenched semiconductor power device of claim 6 further comprising:

a contact dopant regions disposed in said body regions below said source/body contact trenches constituting heavily body dopant regions for enhancing a contact with said contact metal plugs.

8. The trenched semiconductor power device of claim 6 further comprising:

a contact enhancement layer comprising a low resistance metal layer covering said insulation layer for contacting to said contact metal plugs for providing a larger contact area to a source metal layer disposed on top of said contact enhancement layer for reducing a resistance between said source metal layer and said contact metal plugs contacting said source regions and body regions.

9. The trenched semiconductor power device of claim 6 further comprising:

a source metal layer comprising a patterned metal layer disposed on top of said insulation layer for electrically contacting to said metal plugs filling said contact trenches for electrically connected to said source regions and body regions.

10. The trenched semiconductor power device of claim 6 further comprising:

a gate pad layer comprising a patterned metal layer disposed on top of said insulation layer for electrically contacting to said metal plugs filling said contact trenches for electrically connected to said trenched gates.

* * * * *